(12) United States Patent
Wang et al.

(10) Patent No.: US 10,338,752 B2
(45) Date of Patent: Jul. 2, 2019

(54) TOUCH PANEL, MANUFACTURING METHOD THEREOF AND DISPLAY DEVICE

(71) Applicant: BOE TECHNOLOGY GROUP CO., LTD., Beijing (CN)

(72) Inventors: Long Wang, Beijing (CN); Yanzhao Li, Beijing (CN); Yong Qiao, Beijing (CN); Yongchun Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 129 days.

(21) Appl. No.: 14/892,409

(22) PCT Filed: Jun. 5, 2015

(86) PCT No.: PCT/CN2015/080915
§ 371 (c)(1),
(2) Date: Nov. 19, 2015

(87) PCT Pub. No.: WO2016/086632
PCT Pub. Date: Jun. 9, 2016

(65) Prior Publication Data
US 2016/0202795 A1 Jul. 14, 2016

(30) Foreign Application Priority Data

Dec. 3, 2014 (CN) .......................... 2014 1 0728381

(51) Int. Cl.
G06F 3/044 (2006.01)
H01L 29/786 (2006.01)

(52) U.S. Cl.
CPC ........ G06F 3/044 (2013.01); H01L 29/78684 (2013.01); *G06F 2203/04103* (2013.01); *G06F 2203/04111* (2013.01)

(58) Field of Classification Search
CPC .......... G06F 3/041; G06F 2203/04103; G06F 3/044; G06F 2203/04111; H01L 29/78684
(Continued)

(56) References Cited

U.S. PATENT DOCUMENTS

2006/0208320 A1 9/2006 Tsuchiya et al.
2011/0298739 A1* 12/2011 Wu .......................... G06F 3/041
345/173
(Continued)

FOREIGN PATENT DOCUMENTS

CN 1654707 A 8/2005
CN 1715440 A 1/2006
(Continued)

OTHER PUBLICATIONS

Chinese Office Action dated Nov. 30, 2016.
(Continued)

*Primary Examiner* — William Boddie
*Assistant Examiner* — Alecia D. English
(74) *Attorney, Agent, or Firm* — Dilworth & Barrese, LLP.; Michael J. Musella, Esq.

(57) ABSTRACT

A touch panel, a manufacturing method thereof and a display device are disclosed. The method for manufacturing the touch panel includes: forming touch electrodes (4) with topological semiconductor characteristics on a substrate (1), in which the touch electrodes (4) with topological semiconductor characteristics are obtained by a topological treatment on a Ge film with functionalized elements. The touch panel manufactured by the method and the display device including the touch panel have high touch sensitivity.

3 Claims, 2 Drawing Sheets

(58) Field of Classification Search
USPC .......................................... 345/173; 349/160
See application file for complete search history.

(56) References Cited

U.S. PATENT DOCUMENTS

2013/0135239 A1* 5/2013 Yamazaki ........... G02F 1/13454
345/173
2014/0333578 A1* 11/2014 Wu ........................ G06F 3/041
345/174

FOREIGN PATENT DOCUMENTS

| CN | 1838430 A | 9/2006 |
| CN | 102073428 A | 5/2011 |
| CN | 104157698 A | 11/2014 |

OTHER PUBLICATIONS

Elisabeth Bianco et al., Stability and Exfoliation of Germanane: A Germanium Graphane Analogue, Mar. 19, 2013, pp. 4414-4421, ACS NANO, vol. 7, No. 5.
International Search Report dated Sep. 2, 2015.
Second Chinese Office Action dated Jul. 4, 2017.

* cited by examiner (a)

(b)

TOUCH PANEL, MANUFACTURING METHOD THEREOF AND DISPLAY DEVICE

TECHNICAL FIELD

Embodiments of the present invention relate to a touch panel, a manufacturing method thereof and a display device.

BACKGROUND

In the touch control technical field, touch panels include a variety of types such as resistive type, capacitive type, optical type, electromagnetic type and so on. The capacitive touch panel occupies a high proportion in applications due to the advantages of good sensitivity and excellent performances. As for the capacitive touch panel, transparent electrode films constitute essential touch sensing units and can collect touch signals and transmit the touch signals to touch integrated chips (ICs).

In general, indium tin oxide (ITO) may be adopted to form the transparent electrode films of a capacitive touch panel, and it has high conductivity and transparency, and can basically satisfy the demands of the touch panel. But if a transparent electrode film is made from ITO, high electrical conductivity can only be guaranteed after the transparent electrode film is subjected to a high-temperature annealing treatment after film formation. When a substrate for film formation is plastic or a display module, it is limited in a high-temperature process and a transparent electrode film with high electrical conductivity cannot be obtained, and hence the touch sensitivity can be low.

SUMMARY

Embodiments of the present invention provide a touch panel, a manufacturing method thereof and a display device, and the touch panel manufactured by the method has high touch sensitivity.

At least one embodiment of the present invention provides a method for manufacturing a touch panel, and the method comprises: forming touch electrodes with topological semiconductor characteristics on a substrate, in which the touch electrodes with topological semiconductor characteristics are obtained by a topological treatment on a germanium (Ge) film with functionalized elements.

For instance, forming of the touch electrodes with topological semiconductor characteristics on the substrate includes: forming a Ge film on the substrate and forming touch electrode patterns by a patterning process; and obtaining the touch electrodes with topological semiconductor characteristics through the topological treatment on the Ge film with the functionalized elements.

For instance, the functionalized elements comprise fluorine, chlorine, bromine or iodine elements.

For instance, obtaining of the touch electrodes with topological semiconductor characteristics through the topological treatment on the Ge film with the functionalized elements includes: obtaining a germanium halide film with topological semiconductor characteristics by the halogenation of the Ge film with the fluorine, chlorine, bromine or iodine elements.

For instance, the halogenation of the Ge film includes: halogenating the Ge film by a gas-phase process; or halogenating the Ge film by a liquid-phase process; or halogenating the Ge film by a surface modification process; or halogenating the Ge film by a plasma treatment.

For instance, in a case of halogenating the Ge film by a liquid-phase process, halogenating of the Ge film includes: forming a germanium bromide film after halogenating the Ge film in atmosphere of liquid bromine, in which the concentration of the liquid bromine is 1% to 10%, and the processing temperature is 40 to 80° C.

For instance, in a case of halogenating the Ge film by gas-phase process, halogenating of the Ge film includes: forming a germanium iodide film after halogenating the Ge film in atmosphere of iodine gas, with the gas pressure of 1-10 Pa and the processing temperature of 60-100° C.; or forming a germanium bromide film after halogenating the Ge film in atmosphere of bromine gas, with the gas pressure of 1-10 Pa and the processing temperature of 50-400° C.; or forming a germanium chloride film after annealing the Ge film for 10 minutes in atmosphere of chlorine gas with the processing temperature of 50-400° C.

For instance, in a case of halogenating the Ge film by gas-phase process, halogenating of the Ge film includes: forming a germanium chloride film after the halogenation of the Ge film in atmosphere of BCl3 gas, with the gas pressure of 1-10 Pa and the processing temperature of 250-350° C., and annealing the Ge film in atmosphere of halogen gas with the temperature of 90-130° C.

For instance, in a case of halogenating the Ge film by a surface modification process, halogenating of the Ge film includes: coating a halogen-containing organic colloid material on the substrate; and pressing one side of the substrate coated with the organic colloid material onto the Ge film, so that halogen atoms in the organic colloid material are transferred to the Ge film, and hence the halogenation of the Ge film can be achieved.

For instance, in a case of halogenating the Ge film by plasma treatment, halogenating of the Ge film includes: bombing a surface of the Ge film with halogen plasmas in an inductively coupled plasma (ICP) or reactive ion etching (RIE) apparatus, so that the halogen plasmas are adsorbed into the Ge film, and hence the halogenation of the Ge film can be achieved.

For instance, the functionalized elements comprise hydrogen, nitrogen, boron or sulfur elements.

For instance, forming of the Ge film includes: forming the Ge film by an atomic layer deposition method; or forming the Ge film by a chemical vapor deposition (CVD) method; or forming the Ge film by a mechanical exfoliation transfer method; or forming the Ge film by a magnetron sputtering process; or forming the Ge film by a pulse laser deposition process.

For instance, the touch electrodes include first electrodes and second electrodes; the first electrodes are driving electrodes and the second electrodes are sensing electrodes; or the first electrodes are sensing electrodes and the second electrodes are driving electrodes.

At least one embodiment of the present invention further provides a touch panel, which comprises a substrate and touch electrodes formed on the substrate. The touch electrodes are a Ge-containing topological semiconductor film.

For instance, the Ge-containing topological semiconductor film is a germanium halide film formed by halogenation of the Ge film with fluorine, chlorine, bromine or iodine elements.

For instance, the germanium halide film is a single atomic layer germanium halide film, a double atomic layer germanium halide film, or a multi-atomic layer germanium halide film.

For instance, the thickness of the germanium halide film is 0.5 to 10 nm.

For instance, the Ge-containing topological semiconductor film is a topological semiconductor film formed by a topological treatment on the Ge film with hydrogen, nitrogen, boron or sulfur elements.

For instance, the touch electrodes include first electrodes and second electrodes, in which the first electrodes are driving electrodes and the second electrodes are sensing electrodes; or the first electrodes are sensing electrodes and the second electrodes are driving electrodes.

For instance, the first electrodes are disposed on the substrate; the second electrode is disposed on one side of the first electrode away from the substrate; the first electrodes and the second electrodes are arranged in the same layer. An overlapped portion of each first electrode and each second electrode is provided with: a bridge metal layer disposed between the substrate and the second electrode; and an insulating layer disposed between the bridge metal layer and the second electrode, in which the insulating layer is provided with a through hole, and the first electrode is electrically connected with the bridge metal layer via the through hole of the insulating layer.

For instance, the bridge metal layer is made from Mo.

For instance, the first electrodes and the second electrodes are disposed on two sides of the substrate, respectively.

For instance, the first electrodes and the second electrodes are disposed on the same side of the substrate and arranged in different layers.

For instance, the substrate is a glass or flexible film.

At least one embodiment of the present invention further provides a display device, which comprises the touch panel provided by any embodiment of the present invention.

BRIEF DESCRIPTION OF THE DRAWINGS

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

DETAILED DESCRIPTION

Clear and complete description will be given below to the technical proposals in the embodiments of the present invention with reference to the accompanying drawings in the embodiments of the present invention. Obviously, the preferred embodiments are only partial embodiments of the present invention and not all the embodiments. All the other embodiments obtained by those skilled in the art without creative efforts on the basis of the embodiments of the present invention shall fall within the scope of protection of the present invention.

Figure 1:
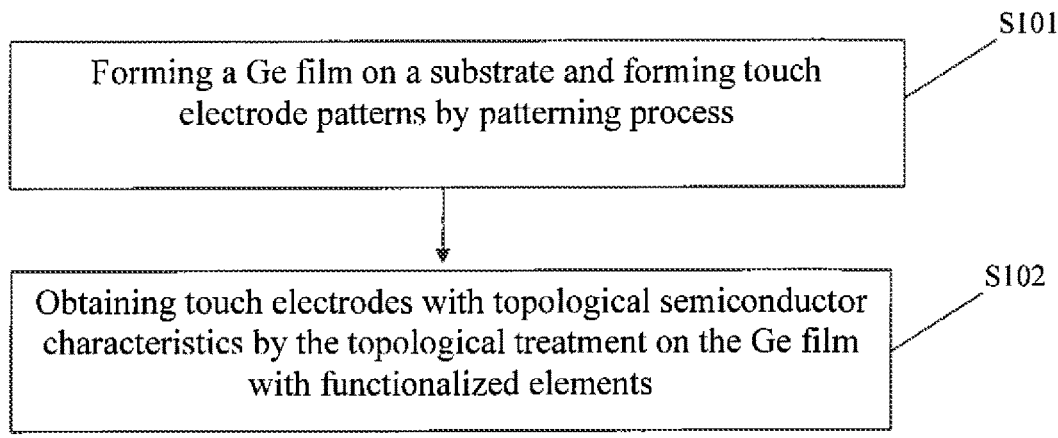
FIG. 1 is a flowchart of a method for manufacturing a touch panel provided by an embodiment of the present invention.
Figure 2:
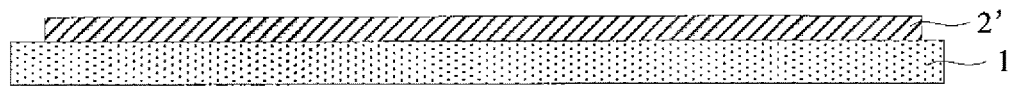
FIG. 2 is a schematic diagram illustrating the process of forming a Ge film on a substrate and forming touch electrode patterns by patterning the Ge film in the method for manufacturing the touch panel provided by an embodiment of the present invention.
Figure 2:
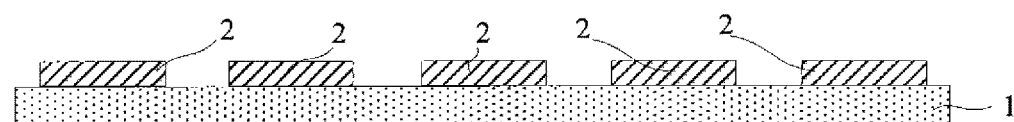
Figure 3:
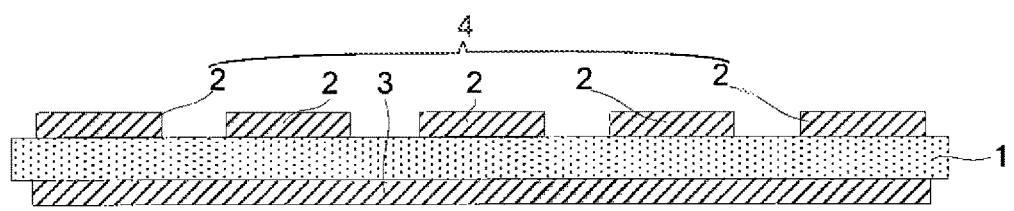
FIG. 3 is a schematic structural longitudinal sectional view of a touch panel provided by an embodiment of the present invention.
Figure 4:
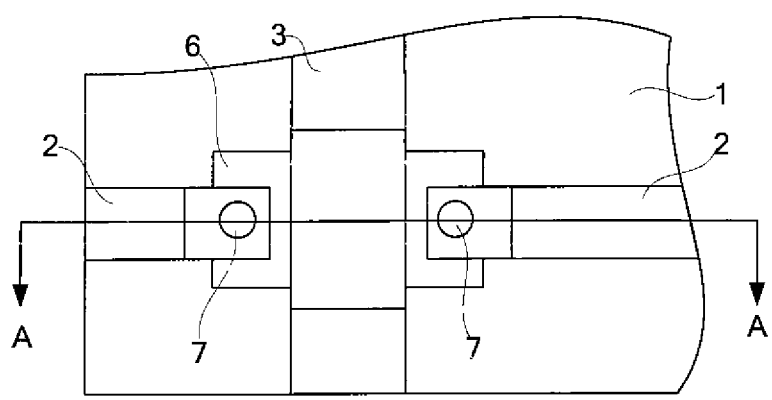
FIG. 4 is a schematic structural view of another touch panel provided by an embodiment of the present invention.
Figure 5:
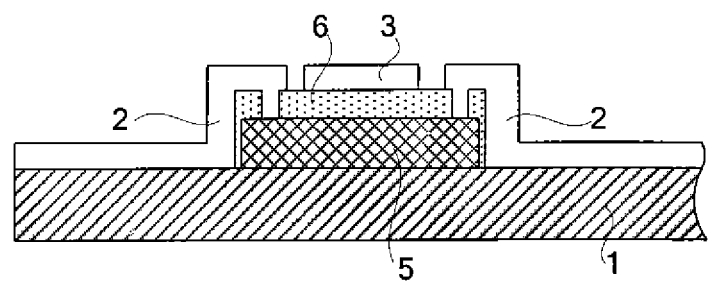
FIG. 5 is a schematic structural longitudinal sectional view of the touch panel in FIG. 4 along direction A-A.

With reference to FIGS. 1 to 5, FIG. 1 is a flowchart of a method for manufacturing a touch panel provided by an embodiment of the present invention; FIG. 2 is a schematic diagram illustrating the process of forming a Ge film on a substrate and forming touch electrode patterns by patterning the Ge film in the method for manufacturing the touch panel provided by an embodiment of the present invention; FIG. 3 is a schematic structural longitudinal sectional view of a touch panel provided by an embodiment of the present invention; FIG. 4 is a schematic structural view of another touch panel provided by an embodiment of the present invention; and FIG. 5 is a schematic structural longitudinal sectional view of the touch panel in FIG. 4 along the direction A-A.

As illustrated in FIGS. 1 to 5, the method for manufacturing the touch panel, provided by the embodiment of the present invention, comprises the following steps.

Touch electrodes 4 with topological semiconductor characteristics are formed on a substrate 1, in which the touch electrodes 4 with topological semiconductor characteristics are obtained by the topological treatment on Ge film with functionalized elements.

In the touch panel manufactured by the method for manufacturing the touch panel, the touch electrodes have topological semiconductor characteristics, and topological semiconductors have the characteristics that the theoretical resistance on surfaces and/or at edges thereof can reach zero. Therefore, the resistance of the touch electrodes is small and the electrical conductivity is high, and hence the touch sensitivity of the touch panel is high.

Therefore, the touch panel manufactured by the method for manufacturing the touch panel has high touch sensitivity.

It should be noted that the topological semiconductors are equivalent to topological insulators.

Topological insulator is a kind of material form that is newly known in recent years. The band structure of a topological insulator is the same as that of an ordinary insulators, and both have a limited energy gap is produced at Fermi level while the topological insulator at boundaries or surfaces thereof has no energy gap and show a Dirac type, spin-nondegenerate, gapless conductive edge state, which is the most unique property different from the ordinary insulator. Such conductive edge state is stable, and information can be transmitted through electronic spin without transmitting through electronic charges as a traditional material. Therefore, the electrical conductivity of topological insulators is better and does not involve dissipation, namely the topological insulators do not produce heat.

A topological insulator is a material that behaves like an insulator in its interior portion but is at a conductive state at a surface or boundary.

Correspondingly, a topological semiconductor is a material that behaves like an insulator in its interior portion but is at a conductive state at a surface or boundary. The topological semiconductor characteristics involve the characteristics that the theoretical resistance at the surface or boundary of a topological semiconductor can reach zero. That is to say, the topological semiconductor characteristics involve the characteristics of a material that behaves like an insulator in its interior portion but has a conductive state at a surface or boundary.

For instance, as illustrated in FIGS. 1 and 2, forming of the touch electrodes with topological semiconductor characteristics on the substrate 1 includes the following steps.

S101: forming a Ge film 2' on the substrate 1 (as illustrated in FIG. 2(a)), and forming the touch electrode patterns by a patterning process (as illustrated in FIG. 2(b)).

S102: obtaining the touch electrodes with topological semiconductor characteristics through the topological treatment on the Ge film with the functionalized elements.

FIG. 2 illustrates the step of forming the touch electrode patterns and the touch electrodes with topological semiconductor characteristics by taking the case that the touch electrodes are first electrodes 2 as an example. The touch electrodes may also include second electrodes.

It should be noted that the sequences of the patterning process and the topological treatment are not limited in the embodiments of the present invention. For instance, the touch electrode patterns may be formed by patterning the Ge film at first and then the patterned Ge film is subjected to a topological treatment. In this case, the boundaries of the touch electrodes are at a conductive state. Or the Ge film may be subjected to a topological treatment at first and then the touch electrode patterns are formed by patterning the Ge film that has been subjected to the topological treatment. In this case, the upper surfaces of the touch electrodes are at a conductive state.

For instance, as illustrated in FIGS. 1 and 2, in the step S101, the process of forming a Ge film may be achieved in the following ways:

forming the Ge film by an atomic layer deposition method;

forming the Ge film by a CVD method;

forming the Ge film by a mechanical exfoliation transfer method;

forming the Ge film by a magnetron sputtering process; and forming the Ge film by a pulse laser deposition process.

For instance, the Ge film may be a single atomic layer Ge film, a double atomic layer Ge film, or a multi-atomic layer Ge film.

As illustrated in FIG. 1, for instance, in the step S102, the functionalized elements may be: fluorine, chlorine, bromine or iodine elements.

As illustrated in FIG. 1, for instance, in the step S102, the process of obtaining the touch electrodes 4 with topological semiconductor characteristics through the topological treatment on the Ge film with the functionalized elements includes: obtaining a germanium halide film with topological semiconductor characteristics through a halogenation treatment on the Ge film with fluorine, chlorine, bromine or iodine elements; for instance a germanium trichloride film may be formed.

For instance, the halogenation treatment on the Ge film may be achieved by the following ways:

(1) halogenating the Ge film by a gas-phase process.

For instance, the first way may include: forming a germanium bromide film with topological semiconductor characteristics after halogenating the Ge film in atmosphere of bromine gas, with the gas pressure of 1-10 Pa and the processing temperature of 50-400° C., namely halogenating the Ge film with the bromine gas; or forming a germanium chloride film with topological semiconductor characteristics after the annealing of the Ge film for 10 min in atmosphere of chlorine gas with the processing temperature of 50-400° C.; or forming a germanium iodide film with topological semiconductor characteristics after halogenating the Ge film in atmosphere of iodine gas, with the gas pressure of 1-10 Pa and the processing temperature of 60-100° C.; or forming a germanium chloride film with topological semiconductor characteristics after the halogenation of the Ge film in atmosphere of BCl3 gas, with the gas pressure of 1-10 Pa and the processing temperature of 250-350° C., and the annealing of the Ge film in atmosphere of halogen gas with the temperature of 90-130° C.

(2) halogenating the Ge film by a liquid-phase process.

For instance, the second way may include: forming a germanium bromide film with topological semiconductor characteristics after halogenating the Ge film in atmosphere of liquid bromine, in which the concentration of the liquid bromine is 1% to 10%, and the processing temperature is 40 to 80° C.

(3) halogenating the Ge film by surface modification process.

For instance, the third way may include: coating a halogen-containing organic colloid material on a base at first; and subsequently, pressing the base coated with the organic film onto the substrate deposited with the Ge film, so that corresponding halogen-containing atomic groups in the organic film are transferred to the Ge film via the hydrophilicity or hydrophobicity of the atomic groups, and hence the halogenation of the Ge film can be achieved. The reaction of the topological treatment on the Ge film by a surface modification process may be performed at the temperature close to the room temperature.

(4) halogenating the Ge film by plasma treatment.

For instance, the fourth way may include: bombing the surface of the Ge film with halogen plasmas in an inductive coupled plasma (ICP) or reactive ion etching (RIE) apparatus or the like by adoption of chlorine gas or carbon tetrachloride (CTC) as a reaction gas, so that the halogen plasmas are adsorbed into the Ge film, and hence the halogenation of the Ge film can be achieved. By adoption of the plasma treatment technology for the topological treatment on the Ge film, the processing temperature is low and the surfaces of film layers may be more uniform.

As illustrated in FIGS. 3 to 5, for instance, the touch electrodes 4 include first electrodes 2 and second electrodes 3; the first electrodes 2 are driving electrodes and the second electrodes 3 are sensing electrodes; or the first electrodes 2 are sensing electrodes and the second electrodes 3 are driving electrodes.

For instance, the first electrodes 2 and the second electrodes 3 may be disposed on the same side of the substrate 1. When the first electrodes 2 and the third electrodes 3 are disposed on the same side of the substrate 1, the first electrodes 2 and the second electrodes 3 may be arranged in the same layer and may also be arranged in different layers.

As illustrated in FIGS. 4 and 5, when the first electrodes 2 and the second electrodes 3 are arranged in the same layer: before the step of forming the Ge film on the substrate 1 and forming the touch electrode patterns by a patterning process, the method further comprise the step S100: depositing a metal layer on the substrate 1 and forming a bridge metal layer 5 by a patterning process; and depositing an insulating layer 6 on the bridge metal layer 5, forming an insulating layer pattern by a patterning process, and forming through holes 7 on the insulating layer 6; and the process of forming the Ge film on the substrate 1 and forming the touch electrode patterns by a patterning process in the step S101 includes: forming the Ge film on the insulating layer 6 and forming a first electrode pattern and a second electrode pattern by a patterning process, in which the first electrodes in the first electrode pattern are electrically connected with the bridge metal layer 5 via the through holes 7 of the insulating layer.

When the first electrodes 2 and the second electrodes 3 are arranged in different layers: the process of forming the Ge film on the substrate 1 and forming the touch electrode patterns by a patterning process in the step S101 includes: forming a first Ge film on the substrate and a forming first electrode pattern by a patterning process; and forming a second Ge film on one side of the first Ge film away from the substrate 1 and forming a second electrode pattern by a patterning process.

At this point, the first electrodes and the second electrodes are disposed on the same side of the substrate 1, and an insulating layer may be formed between the first electrodes and the second electrodes.

In another preferred embodiment, the first electrodes 2 and the second electrodes 3 may be disposed on two opposite sides of the substrate 1. As illustrated in FIG. 3, when the first electrodes 2 and the second electrodes 3 are disposed on two opposite sides of the substrate 1, the process of forming the Ge film on the substrate 1 and forming the touch electrode patterns by a patterning process in the step S101 includes: forming a first Ge film on a first side surface of the substrate 1 and forming a first electrode pattern by a patterning process; and forming a second Ge film on a second side surface, opposite to the first side surface, of the substrate 1 and forming a second electrode pattern by a patterning process.

For instance, in the step S102, the functionalized elements may also be hydrogen, nitrogen, boron or sulfur elements.

For instance, the functionalized elements include any one selected from fluorine, chlorine, bromine, iodine, hydrogen, nitrogen, boron and sulfur elements.

As illustrated in FIG. 3, an embodiment of the present invention further provides a touch panel, which comprises a substrate 1 and touch electrodes 4 formed on the substrate 1. The touch electrodes 4 are a Ge-containing topological semiconductor film. The touch panel has high touch sensitivity.

For instance, the Ge-containing topological semiconductor film may be a germanium halide film formed by the halogenation of the Ge film via fluorine, chlorine, bromine or iodine elements.

For instance, the germanium halide film may be a single atomic layer germanium halide film, a double atomic layer germanium halide film or a multi-atomic layer germanium halide film. For instance, the thickness of the germanium halide film is from 0.5 to 10 nm.

For instance, the Ge-containing topological semiconductor film may also be a topological semiconductor film formed by the topological treatment on the Ge film with hydrogen, nitrogen, boron or sulfur elements.

As illustrated in FIGS. 3 to 5, for instance, in one embodiment, the touch electrodes 4 include first electrodes 2 and second electrodes 3, in which the first electrodes 2 are driving electrodes and the second electrodes 3 are sensing electrodes; or the first electrodes 2 are sensing electrodes and the second electrodes 3 are driving electrodes.

As illustrated in FIGS. 4 and 5, for instance, in one embodiment, the first electrodes 2 and the second electrodes 3 are disposed on the same side of the substrate 1; the second electrode 3 may be disposed on one side of the first electrode 2 away from the substrate 1; the first electrodes 2 and the second electrodes are arranged in the same layer; and an overlapped portion of each first electrode 2 and each second electrode 3 is provided with: a bridge metal layer 5 disposed between the substrate 1 and the second electrodes 3, and an insulating layer disposed between the bridge metal layer 5 and the second electrodes 3, in which the insulating layer 6 is provided with through holes 7 and the first electrodes 2 may be electrically connected with the bridge metal layer 5 via the through holes 7 of the insulating layer 6 respectively. For instance, the bridge metal layer 5 is made from Mo.

As illustrated in FIG. 3, in another embodiment, the first electrodes 2 and the second electrodes 3 may be respectively disposed on either side of the substrate 1.

For instance, as illustrated in FIG. 3, the substrate 1 may be a glass or flexible film.

For instance, the first electrodes 2 and the second electrodes 3 may be arranged in the same layer or may be arranged in different layers. When the first electrodes 2 and the second electrodes 3 are arranged in different layers, the following manufacturing process may be adopted: forming the Ge film on the substrate 1 and forming the touch electrode patterns by a patterning process, which process includes: forming a first Ge film on the substrate 1 and forming a first electrode pattern by a patterning process; and forming a second Ge film on one side of the first Ge film away from the substrate 1 and forming a second electrode pattern by a patterning process.

The above embodiments are only brief description of the main invention points of the present invention. The present invention is not limited thereto. Any touch panel containing the essential inventive points of the present invention shall fall within the scope of protection of the present invention.

An embodiment of the present invention further provides a display device, which comprises any foregoing touch panel and has high touch sensitivity.

For instance, the display device may be a display such as a liquid crystal display (LCD), e-paper and an organic light-emitting diode (OLED) display or any product or component having display function and comprising the display, e.g., a TV, a digital camera, a mobile phone, a watch, a tablet PC, a notebook computer and a navigator.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The application claims priority to the Chinese patent application No. 201410728381.5, filed on Dec. 3, 2014, the disclosure of which is incorporated herein by reference as part of the application.

The invention claimed is:

1. A method for manufacturing a touch panel, comprising:
    forming touch electrodes with topological semiconductor characteristics on a substrate, wherein the touch electrodes with topological semiconductor characteristics are obtained by a topological treatment on a germanium (Ge) film with functionalized elements, and each of the touch electrodes with topological semiconductor characteristics is at a state of insulation in its interior portion but is at a conductive state at a surface or boundary; each of the touch electrodes has a single-layer structure;
    the functionalized elements comprise fluorine, chlorine, bromine or iodine elements;
    obtaining of the touch electrodes with topological semiconductor characteristics through the topological treatment on the Ge film with the functionalized elements includes: obtaining a germanium halide film with topological semiconductor characteristics by halogenation of the Ge film via the fluorine, chlorine, bromine or iodine elements, wherein in a case of halogenating the Ge film by a liquid-phase process, halogenating of the Ge film includes:

forming a germanium bromide film after halogenating the Ge film in atmosphere of liquid bromine, in which a concentration of the liquid bromine is 1% to 10%, and a processing temperature is 40 to 80° C.;

in a case of halogenating the Ge film by a gas-phase process, halogenating of the Ge film includes:

forming a germanium iodide film after halogenating the Ge film in atmosphere of iodine gas, with a gas pressure of 1-10 Pa and a processing temperature of 60-100° C.; or forming a germanium bromide film after halogenating the Ge film in atmosphere of bromine gas, with a gas pressure of 1-10 Pa and a processing temperature of 50-400° C.; or forming a germanium chloride film after annealing the Ge film for 10 minutes in atmosphere of chlorine gas with a processing temperature of 50-400° C.;

in a case of halogenating the Ge film by a gas-phase process, halogenating of the Ge film includes:

forming a germanium chloride film after halogenation of the Ge film in atmosphere of BCl3 gas, with a gas pressure of 1-10 Pa and a processing temperature of 250-350° C., and annealing the Ge film in atmosphere of halogen gas with a temperature of 90-130° C.

2. A method for manufacturing a touch panel, comprising:

forming touch electrodes with topological semiconductor characteristics on a substrate, wherein the touch electrodes with topological semiconductor characteristics are obtained by a topological treatment on a germanium (Ge) film with functionalized elements, and each of the touch electrodes with topological semiconductor characteristics is at a state of insulation in its interior portion but is at a conductive state at a surface or boundary; each of the touch electrodes has a single-layer structure;

the functionalized elements comprise fluorine, chlorine, bromine or iodine elements;

obtaining of the touch electrodes with topological semiconductor characteristics through the topological treatment on the Ge film with the functionalized elements includes: obtaining a germanium halide film with topological semiconductor characteristics by halogenation of the Ge film via the fluorine, chlorine, bromine or iodine elements, wherein in case of halogenating the Ge film by a surface modification process, halogenating of the Ge film includes:

coating a halogen-containing organic colloid material on the substrate; and pressing one side of the substrate coated with the organic colloid material onto the Ge film, so that halogen atoms in the organic colloid material are transferred to the Ge film, and hence halogenation of the Ge film can be achieved.

3. A method for manufacturing a touch panel, comprising:

forming touch electrodes with topological semiconductor characteristics on a substrate, wherein the touch electrodes with topological semiconductor characteristics are obtained by a topological treatment on a germanium (Ge) film with functionalized elements, and each of the touch electrodes with topological semiconductor characteristics is at a state of insulation in its interior portion but is at a conductive state at a surface or boundary; each of the touch electrodes has a single-layer structure;

the functionalized elements comprise fluorine, chlorine, bromine or iodine elements;

obtaining of the touch electrodes with topological semiconductor characteristics through the topological treatment on the Ge film with the functionalized elements includes: obtaining a germanium halide film with topological semiconductor characteristics by halogenation of the Ge film via the fluorine, chlorine, bromine or iodine elements, wherein in case of halogenating the Ge film by a plasma treatment, halogenating of the Ge film includes:

bombing a surface of the Ge film with halogen plasmas in an inductively coupled plasma (ICP) or reactive ion etching (RIE) apparatus, so that the halogen plasmas are adsorbed into the Ge film, and hence halogenation of the Ge film can be achieved.

* * * * *